United States Patent [19]
Bhat

[11] Patent Number: 5,226,383
[45] Date of Patent: Jul. 13, 1993

[54] GAS FOIL ROTATING SUBSTRATE HOLDER

[75] Inventor: Rajaram Bhat, Middletown, N.J.

[73] Assignee: Bell Communications Research, Inc., Livingston, N.J.

[21] Appl. No.: 973,244

[22] Filed: Nov. 9, 1992

Related U.S. Application Data

[63] Continuation-in-part of Ser. No. 889,601, May 27, 1992, abandoned, which is a continuation-in-part of Ser. No. 849,973, Mar. 12, 1992.

[51] Int. Cl.⁵ .............................................. C23C 16/00
[52] U.S. Cl. ...................................... 118/730; 118/500
[58] Field of Search ................................ 118/730, 500

[56] References Cited

U.S. PATENT DOCUMENTS 4,961,399 10/1990 Frijlink ............................... 118/730

OTHER PUBLICATIONS

P. M. Frijlink, "A new versatile, large size MOVPE reactor," *Journal of Crystal Growth*, 1988, vol. 93, pp. 207–215.

"Substrate Rotation Cell," 'MR226'/'MR350', product information sheet of MR Semicon, 2 pp. (date unknown).

*Primary Examiner*—Richard Bueker
*Attorney, Agent, or Firm*—Leonard Charles Suchyta; Charles S. Guenzer

[57] ABSTRACT

A gas foil susceptor for rotating a wafer (16) during growth in a chemical vapor deposition chamber. Inner and outer annular grooves (24, 26) are formed at the bottom of a tapered depression (14) in the upper surface of a base (10). Feed and discharge tubes (28, 32) extend laterally from the annular grooves to the exterior (34) of the base. A disk (12) is fit within the depression and bears the wafer (16) on its upper surface. Three spiral channels (38, 40, 42) are formed on the bottom of the disk and their inner and outer ends (44, 46) overlie the inner and outer circular channels respectively. A gas flow is set up between the two circular channels and impinges the sides of the spiral channels to thereby rotate the disk and the wafer on it. When the base and disk are made of graphite, an external RF coil can controllably heat the wafer.

10 Claims, 3 Drawing Sheets

GAS FOIL ROTATING SUBSTRATE HOLDER

RELATED APPLICATION

This application is a continuation-in-part of Ser. No. 07/889,601, filed May 27, 1992, now abandoned, which is a continuation-in-part of Ser. No. 07/849,973, filed Mar. 12, 1992.

FIELD OF THE INVENTION

The invention relates generally to apparatus used in growth of thin films. In particular, the invention relates to apparatus used in rotating a wafer during growth of a thin film upon the wafer.

BACKGROUND ART

In the parent U.S. patent application, Ser. No.07/849,973, filed Mar. 12, 1992, I describe a reactor cell that is used to epitaxially grow a thin film by organo-metallic chemical vapor deposition (OMCVD), alternatively called metalorganic vapor phase epitaxy (MOVPE). That reactor can accommodate one wafer at a time and thus is appropriate for research and other applications not requiring a high throughput of wafers.

I describe there in general terms a rotating susceptor which holds a single wafer and rotates it while the gases used in OMCVD flow over the wafer. It is called a susceptor because, in addition to holding the wafer, it is made of graphite and can be inductively heated by an RF coil located outside the reactor cell, thereby controllably heating the wafer to the desired deposition temperature.

Frijlink has disclosed a similar though more complex wafer holder in U.S. Pat. No. 4,961,399 and in "A new versatile, large size MOVPE reactor," *Journal of Crystal Growth*, volume 93, 207-215, 1988. Frijlink's wafer holder is intended for large-scale production of layered wafers and can accommodate seven wafers in a planetary structure. Seven rotating disks, each holding a wafer, are supported on a rotating platform. In each case, spiral channels are formed in the otherwise planar structure supporting the disks or the platform. Gas flowing through the spiral channels frictionally engage through viscous laminar flow the overlying, planar bottom surfaces of the disks or platform, thereby rotating them. The gas forms a gas foil beneath the entire disk or platform, thereby supporting them.

Frijlink's wafer holder is not appropriate for a susceptor intended for small-scale production of one wafer at a time. The planetary structure is overly complex, and its design is predicated on the circularly symmetrical and radially outward flow of the OMCVD reaction gases over the seven wafers. In contrast, in a reactor of the type I have described, the reaction gases flow linearly over the single wafer. Also, often a small susceptor is vertically tilted by a few degrees so as to intercept the flow of the reaction gases, to thereby counteract any reactive depletion of the gas flow. Several aspects of Frijlink's design may cause problems if his wafer holder is tilted. Frijlink's article and U.S. patent do not disclose full details on the supply and discharge of the rotator gas, but it appears to discharge radially from the ends of the spirals.

SUMMARY OF THE INVENTION

The invention may be summarized as a rotating, gas foil substrate holder in which a pattern of one or more spiral channels is formed on the bottom of a thin disk, on the top of which the growth substrate will be placed. The disk is placed in a circular depression on the top surface of a base. Circular channels are formed in the top surface of the circular depression corresponding to the ends of the spiral channels. The inner annular groove is connected to an external gas supply and the outer annular groove is vented so that the flow of gas causes the disk and its supported substrate to float over a foil of gas and to rotate as the gas flow interacts with the spiral pattern in the disk.

DETAILED DESCRIPTION OF THE PREFERRED EMBODIMENT

Figure 1:
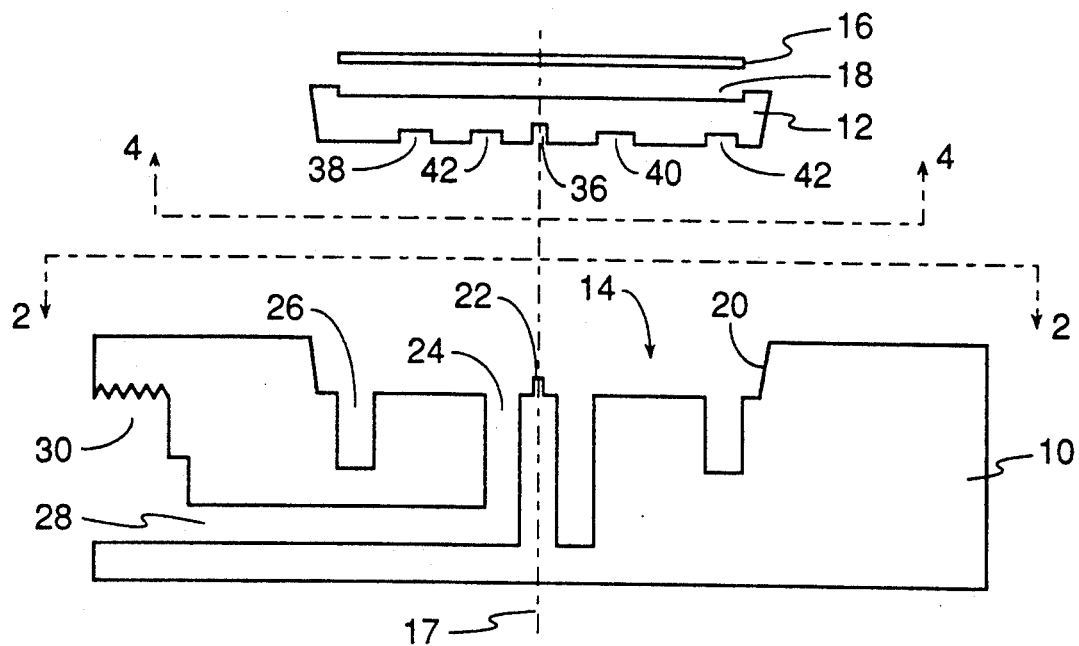
FIG. 1 is a cross-sectional view of the base, disk, and wafer of a first embodiment of the susceptor of the invention, taken along sectional lines 1—1 of FIGS. 2 and 4.

An embodiment of the invention includes a base 10 and a circular disk 12 illustrated in cross-section in FIG. 1. Additionally, the base 10 is illustrated in top plan view in FIG. 2, and the disk in bottom plan view in FIG. 3. In use, the disk 12 is placed within a truncated conical depression 14 on the top surface of the base 10, and a semiconductor wafer 16 is placed within a cylindrical depression 18 on the top surface of the disk 12. The top and side portions of the disk 12 and the conical depression 14 are circularly symmetric about a vertical axis 17 along which the disk 12 and base 10 are assembled. The illustrated susceptor is designed for a wafer 16 having a diameter of 2 inches (5 cm). Both the base 10 and the disk 12 are machined from graphite although they could be made from a metal that is non-reactive with the gases used for OMCVD.

Figure 2:
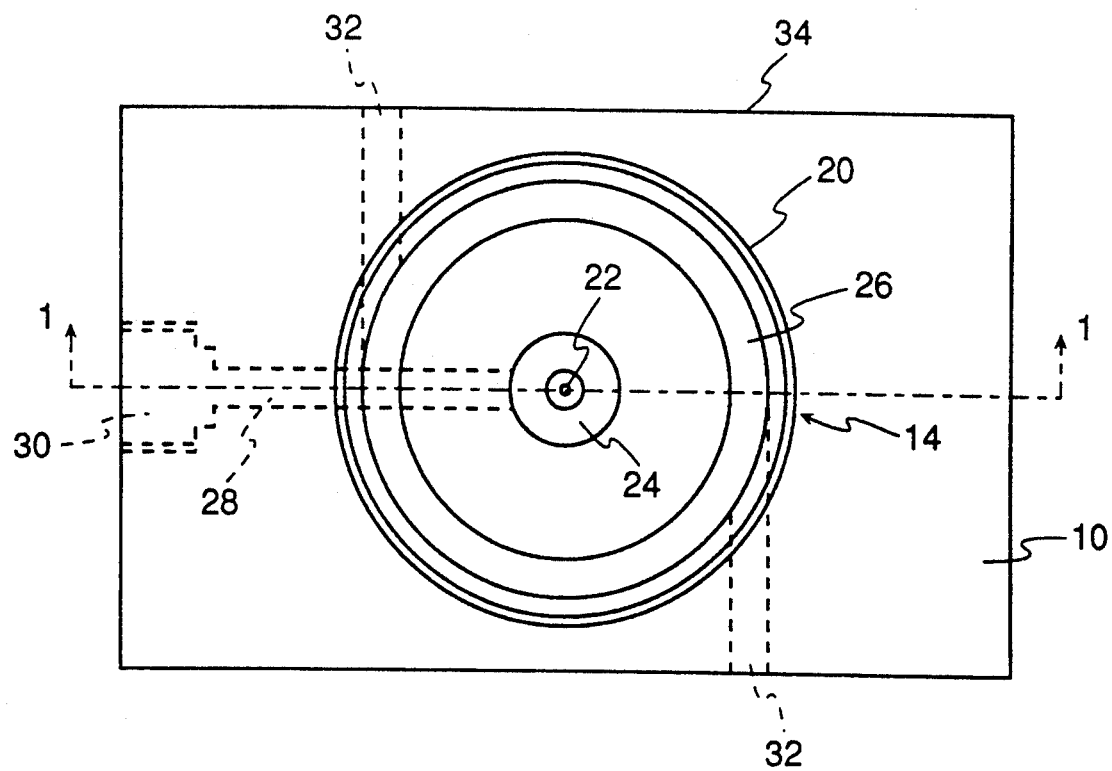
FIG. 2 is a top plan view of the base of FIG. 1, taken along view line 2—2 of FIG. 1 and additionally showing some hidden features.
Figure 3:
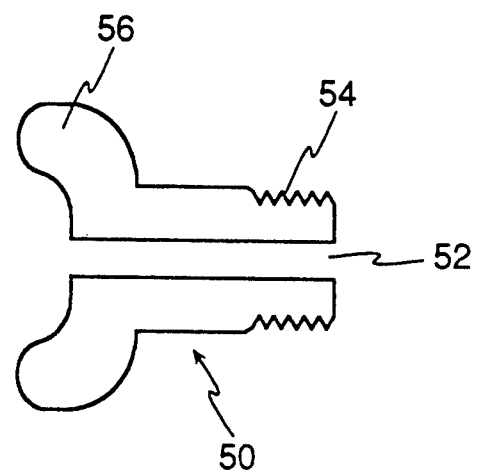
FIG. 3 is a cross-sectional view of a connector to be screwed into the base.

As illustrated in FIGS. 1 and 2, the base 10 has a generally rectangular shape. The conical depression 14 has a side wall 20 tilting upwardly outward at about 5°, and a knob 22 is left at the center of its bottom. An inner annular groove 24 and an outer annular groove 26 are concentrically formed around the vertical axis 17 at the bottom of the conical depression 14. The outer annular groove 26 is shallower than the inner annular groove 24 so as to avoid a feed tube 28 connecting a threaded hole 30 to the inner annular groove 24. A graphite connector 50, illustrated in cross section in FIG. 3, has a central bore 52 connecting a threaded end 54 to be screwed into the threaded hole 30 and a socket 56 of a ball-and-socket joint through which gas is supplied to the rotating susceptor. Two discharge tubes 32 are bored from opposing side walls 34 to the outer annular groove 26 and are positioned so as to be approximately tangential to the outer annular groove 26 and present smooth continuations for the flow of gas in the spiral channels to be described later. Alternatively, one such discharge tube 32 would suffice, or the discharge tube could be nearly perpendicular to the outer annular groove 26, but a sharp reversal of the air flow should be avoided. The feed and discharge tubes 28 and 32 may be characterized as pipe channels because they are open only on their ends.

Figure 4:
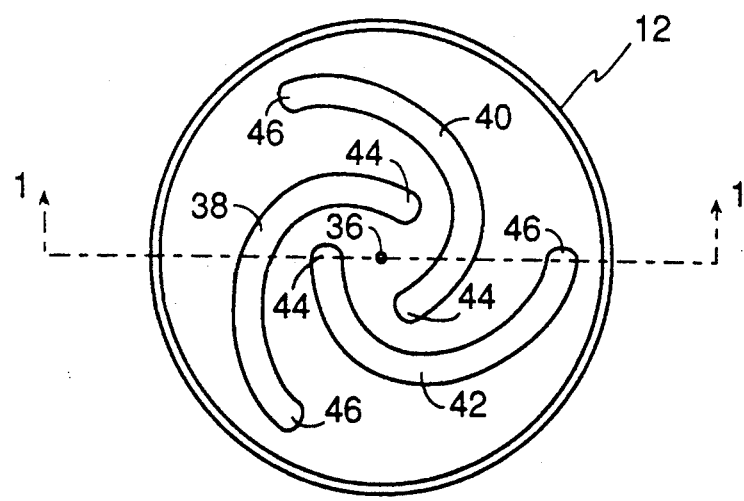
FIG. 4 is a bottom plan view of the disk of FIG. 1, taken along view line 4—4 of FIG. 1.

As illustrated in FIGS. 1 and 4, the disk 12 has a tapered shape with side walls tilted at about 5° so as to fit within the conical depression 14 of the base 10 with a lateral clearance of 1/64 inch (0.4 mm) when the disk 12 is at the bottom of the conical depression 14. The depth of the conical depression 14 is slightly more than the thickness of the disk 12, which is 89 mils (2.3 mm), and the depth of the cylindrical depression 18 in the disk 12 is the same as the thickness of the wafer 16 so that, when the disk 12 is floating on the gas foil, the top surfaces of the disk 12 and the wafer 16 are nearly flush with that of the base 10. A centered hole 36 is formed in the bottom of the disk 12 and has a size slightly larger than that of the knob 22 of the base 10 so as to receive the knob 22 and thereby prevent any rubbing of the edges of the disk 12 against the edges 20 of the conical depression 14 when the base 10 is slightly tilted.

Three spiral channels 38, 40, and 42 are symmetrically formed in the bottom of the disk 12 at angular displacements of 120°. Each has a width of ⅛ inch (3 mm), which is twice the widths of the annular grooves 24 and 26, and a depth of 13 mils (0.33 mm). Their inner ends 44 are positioned to overlie the inner annular groove 24 of the base 10, and their outer ends 46 are positioned to overlie the outer circular channel 26 when the disk 12 is centered in the conical depression 14. When viewed from the center of the disk 12, each spiral channel 38, 40, or 42 extends over an angular range of 180° with the radius to the disk center linearly varying with angle except that the portions near the ends 44 and 46 are somewhat more circumferential.

When the susceptor of FIGS. 1 through 4 is used, the wafer 16 to be used as the substrate is placed in the cylindrical depression 18 of the disk 12, and the disk 12 is placed into the conical depression 14 of the base 10 with the spiral channels 38, 40, and 42 of the disk 12 facing the annular grooves 24 and 26 of the base 10. The base 10 is then slid into the reactor cell described in the parent patent application with the threaded hole 30 facing the downstream direction. If the wafer 16 is to be tilted with respect to the gas flow, a block is placed at the bottom of the base beneath the area of the threaded hole 30.

A gas line for ultra-pure hydrogen terminates in a ball which mates with the socket 56 of the connector 50 screwed into the threaded hole 30 and is connected to the exterior of the reactor cell. A flow controller between the hydrogen gas supply and the susceptor controls the amount of gas supplied to the susceptor, which also depends on the pressure within the reactor cell. The hydrogen enters the inner annular groove 24. The major part of the hydrogen gas flow follows the spiral channels 38, 40, and 42 from their inner ends 44 to their outer ends 46, at which points the hydrogen flows into the outer annular groove 26 and then tangentially and smoothly out through the discharge tube 32. The viscous flow of the hydrogen against the walls of the spiral channels 38, 40, and 42 torques the disk 12 and, at a sufficiently high gas flow, causes it to rotate. The disk 12 floats on a thin layer of the hydrogen, referred to as a gas foil, between it and the planar bottom of the conical depression 14. An external RF coil inductively couples electrical energy into the conductive graphite body 10 and disk 12 so as to controllably heat the wafer 16 to the desired deposition temperature.

The design of the susceptor of FIGS. 1 through 4 provides several advantages over that of Frijlink. The outer annular groove 26 is positioned beneath the outer ends 46 of the spiral channels 38, 40, and 42. Thereby, almost the entire pressure drop of the hydrogen occurs within the spiral channels 38, 40, and 42 where the torquing is occurring. The spiral channels 38, 40, and 42 are formed in the rotating disk 12 rather than in the body 10 so that the spiral side walls are able to more effectively transfer the momentum of the gas to the rotating member, thereby minimizing the required gas flow. Furthermore, the disk 12 may be made of metal, which is stronger and more easily machined. Its thinness reduces the weight which the gas foil needs to support. The tapered side walls 20 of the conical depression 14 and those of the disk 12 allow easier insertion of the disk 12 into the body 10 while maintaining a minimum lateral clearance and reduce the tendency of the disk 12 to rub against the edge 20 of the conical depression 14 when the disk 12 is rotated while the base 10 is tilted.

I have found that the performance of the rotating susceptor can be improved if the spiral grooves stop short of the outer annular groove. In a second embodiment of a disk 50, illustrated in the bottom plan view of FIG. 5, symmetrically formed spiral channels 52, 54, and 56 extend over a shorter radial distance than the corresponding spiral channels 38, 40, and 42 of FIG. 4. Both the outer circular channel 26 and the spiral channels 52, 54, and 56 have widths of ⅛" (3.14 mm), but, while the outer circular channel 26 has a mean radius of 31/32"(24.6 mm), the mean radius of ends 58 of the spiral channels is 23/32"(21.4 mm). As a result, the maximal radial extent of the spiral channels 52, 54, and 56 is separated from the minimal radial extent of the outer circular channel 26 by ⅛"(3.14 mm). If the spiral configuration is same as that of FIG. 4, the spiral channels 38, 40, and 42 angularly extend over 120° as measured from the centered hole 36. The inner ends 44 of the spiral channels continue to overlie the inner circular channel 24.

Figure 5:
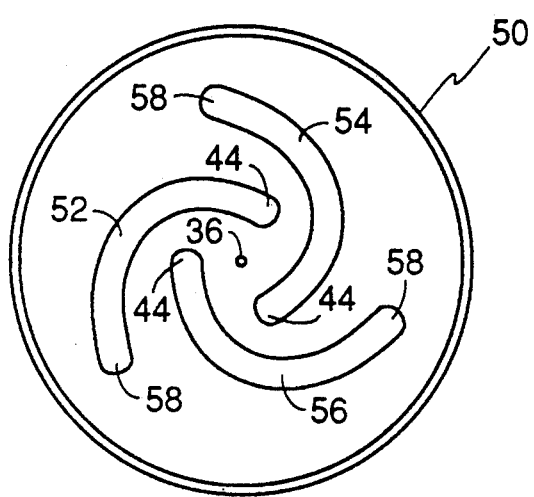
FIG. 5 is a bottom plan view of a second embodiment of the disk of FIG. 1, taken along view line 4—4 of FIG. 1.

The disk 50 of FIG. 5 forces the hydrogen to flow between the flat surface of the disk 50 and the bottom planar surface of the depression 14 of the base 10 in reaching the outer circular channel 26. As a result, lift is improved and lower hydrogen gas flows can be used.

Numerous modifications may be made to the described embodiment without departing from the claimed features of the inventions. The spiral channels should be symmetrically placed and should number more than one. Their shape need not follow that of a regularly increasing spiral over 180°. The inner groove could extend to zero radius. The gas flow can be reversed. Other forms of temperature control can be used.

What is claimed is:

1. A rotating substrate holder, comprising:
   a base having a circular first depression formed in an upper surface;
   a first annular groove formed in a bottom of said first depression at a first radius from a center of said first depression;
   a second annular groove formed in said bottom at a second radius from said center, said second radius being larger than said first radius;
   a circular disk fittable in said first depression for bearing a substrate on an upper surface thereof;

a plurality of spiral channels substantially symmetrically formed in a bottom surface of said disk fitted in said first depression, each of said spiral channels extending from a third radius from a center of said disk to a fourth radius from said center of said disk, said spiral channels extending in an annular area between said first and second radii when said disk is fitted in said first depression; and first and second pipe channels formed in said base extending from said first and second annular grooves respectively to exterior portions of said base other than said first depression.

2. A holder as recited in claim 1, wherein said fourth radius is less than said second radius and said spiral channels do not overlie said second annular groove when said disk is fitted in said first depression.

3. A holder as recited in claim 2, wherein said first radius substantially equals said third radius.

4. A holder as recited in claim 2, wherein said first depression and said disk fitted in said first depression are correspondingly tapered on their lateral sides.

5. A holder as recited in claim 4, wherein said first annular groove is deeper than said second annular groove and said first and second pipe channels extend horizontally from respective lateral sides of said first and second annular grooves.

6. A holder as recited in claim 5, wherein said second pipe channel extends approximately tangentially from said second annular groove and in a direction along which said spiral channels extend in approaching said second radius when said disk is fitted into said first depression.

7. A holder as recited in claim 5, further comprising a circular second depression formed in said upper surface of said disk for holding said substrate.

8. A rotating substrate holder, comprising:
a base having a circular depression formed in a surface;
an annular groove formed in said bottom around a center of said first depression;
a circular disk fittable in said first depression; and
a plurality of spiral grooves formed in a bottom of said disk extending radially outwardly to a distance such that said spiral grooves overlie an area extending radially inwardly from said annular groove but do not overlie said annular groove when said disk is fitted in said depression.

9. A rotating substate holder as recited in claim 8, further comprising a second annular groove formed in said bottom, wherein said spiral grooves are symmetrically formed about said center and inner portions of said spiral grooves overlie said second annular groove.

10. A rotating substrate holder as recited in claim 9, further comprising a gas supply pipe channel formed in said base and connected on one end to said second annular groove.

* * * * *

UNITED STATES PATENT AND TRADEMARK OFFICE
CERTIFICATE OF CORRECTION

PATENT NO. : 5,226,383

DATED : July 13, 1993

INVENTOR(S) : Rajaram Bhat

It is certified that error appears in the above-identified patent and that said Letters Patent is hereby corrected as shown below:

Column 6, line 10, after "in" change "said" to --the--,
        line 10, after "bottom" insert --of said depression--;
        line 11, after "said" delete "first";
        line 12, after "said" delete "first".

Signed and Sealed this

Twenty-fifth Day of January, 1994

Attest:

BRUCE LEHMAN

*Attesting Officer*     *Commissioner of Patents and Trademarks*